US011830756B2

(12) United States Patent
Carney et al.

(10) Patent No.: US 11,830,756 B2
(45) Date of Patent: *Nov. 28, 2023

(54) TEMPORARY DIE SUPPORT STRUCTURES AND RELATED METHODS

(71) Applicant: SEMICONDUCTOR COMPONENTS INDUSTRIES, LLC, Phoenix, AZ (US)

(72) Inventors: Francis J. Carney, Mesa, AZ (US); Michael J. Seddon, Gilbert, AZ (US)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 165 days.

This patent is subject to a terminal disclaimer.

(21) Appl. No.: 16/862,063

(22) Filed: Apr. 29, 2020

(65) Prior Publication Data

US 2021/0343568 A1 Nov. 4, 2021

(51) Int. Cl.
*B32B 43/00* (2006.01)
*H01L 21/683* (2006.01)

(52) U.S. Cl.
CPC ........ *H01L 21/6835* (2013.01); *B32B 43/006* (2013.01); *B32B 2307/732* (2013.01); *H01L 2221/6834* (2013.01); *H01L 2221/68354* (2013.01); *H01L 2221/68386* (2013.01)

(58) Field of Classification Search
CPC .... B32B 38/10; B32B 43/006; H01L 21/6835
See application file for complete search history.

(56) References Cited

U.S. PATENT DOCUMENTS

| 5,476,566 A | * | 12/1995 | Cavasin | H01L 21/6835 |
| | | | | 156/154 |
| 9,653,335 B2 | * | 5/2017 | Kato | C09J 183/04 |
| 2004/0259332 A1 | * | 12/2004 | Fukuoka | H01L 21/67132 |
| | | | | 438/464 |
| 2010/0041211 A1 | * | 2/2010 | Noda | H01L 21/6835 |
| | | | | 438/464 |
| 2012/0104580 A1 | | 5/2012 | Feng et al. | |
| 2015/0017434 A1 | * | 1/2015 | Dronen | B32B 38/10 |
| | | | | 428/352 |
| 2015/0031215 A1 | * | 1/2015 | Mahoney | H01L 21/6836 |
| | | | | 438/759 |

* cited by examiner

*Primary Examiner* — Philip C Tucker
*Assistant Examiner* — Nickolas R Harm
(74) *Attorney, Agent, or Firm* — Adam R. Stephenson, LTD.

(57) ABSTRACT

Implementations of a semiconductor device may include a semiconductor die comprising a first largest planar surface, a second largest planar surface and a thickness between the first largest planar surface and the second largest planar surface; and a temporary die support structure coupled to one of the first largest planar surface, the second largest planar surface, the thickness, or any combination thereof. The thickness may be between 0.1 microns and 125 microns. The warpage of the semiconductor die may be less than 200 microns.

15 Claims, 5 Drawing Sheets

TEMPORARY DIE SUPPORT STRUCTURES AND RELATED METHODS

BACKGROUND

1. Technical Field

Aspects of this document relate generally to semiconductor packages, such as wafer scale or chip scale packages. More specific implementations involve packages including an encapsulating or mold compound.

2. Background

Semiconductor packages work to facilitate electrical and physical connections to an electrical die or electrical component in the package. A protective cover or molding has generally covered portions of the semiconductor packages to protect the electrical die or electrical component from, among other things, the environment, electrostatic discharge, and electrical surges.

SUMMARY

Implementations of a semiconductor device may include a semiconductor die comprising a first largest planar surface, a second largest planar surface and a thickness between the first largest planar surface and the second largest planar surface; and a temporary die support structure coupled to one of the first largest planar surface, the second largest planar surface, the thickness, or any combination thereof. The thickness may be between 0.1 microns and 125 microns. The warpage of the semiconductor die may be less than 200 microns.

Implementations of a semiconductor device may include one, all, or any of the following:

The warpage of the semiconductor die may be less than 25 microns.

The perimeter of the semiconductor die may be rectangular and a size of the semiconductor die may be at least 6 mm by 6 mm.

The perimeter of the semiconductor die may be rectangular and a size of the semiconductor die may be 211 mm by 211 mm or smaller.

The temporary die support structure may be configured to be removable by one of exposure to light, ultrasonic energy, peeling, etching, grinding, or any combination thereof.

The perimeter of the semiconductor die may include a closed shape.

The temporary die support structure may include a perimeter comprising a closed shape.

The device may include a second temporary die support structure coupled to one of the first largest planar surface, the second largest planar surface, the thickness, or any combination thereof.

The temporary die support structure may include two or more layers.

Implementations of a die support structure may include a material configured to be temporarily coupled with a semiconductor die comprising a first largest planar surface, a second largest planar surface and a thickness between the first largest planar surface and the second largest planar surface where the material may be configured to be coupled to one of the first largest planar surface, the second largest planar surface, the thickness, or any combination thereof. The thickness of the semiconductor die may be between 0.1 microns and 125 microns.

Implementations of a die support structure may include one, all, or any of the following:

The material may be configured to reduce a warpage of the semiconductor die to less than 200 microns.

The temporary die support structure may be configured to be removable by one of exposure to light, ultrasonic energy, peeling, etching, grinding, or any combination thereof.

The material may include a perimeter comprising a closed shape.

The material may be a first portion of material and may include a second portion of material configured to be temporarily coupled to one of the first largest planar surface, the second largest planar surface, the thickness, or any combination thereof.

Implementations of a method of forming a die support structure may include temporarily coupling a material with a semiconductor die. The semiconductor die may include a first largest planar surface, a second largest planar surface and a thickness between the first largest planar surface and the second largest planar surface. The material may be coupled with one of the first largest planar surface, the second largest planar surface, the thickness, or any combination thereof. The method may include reducing a warpage of the semiconductor die to less than 200 microns through the material.

Implementations of a method of forming a die support structure may include, one, all, or any of the following:

The method may include removing the material using one of light, etching, peeling, ultrasonic energy, grinding, or any combination thereof.

The method may include removing the material after bonding the semiconductor die to one of a substrate, a leadframe, a second semiconductor die, a lead, a redistribution layer, and any combination thereof.

The material may include a perimeter comprising a closed shape.

The material may be a first portion of material and may include: temporarily coupling a second portion of material with one of the first largest planar surface, the second largest planar surface, the thickness, or any combination thereof.

The second portion of material may be a second layer of material coupled over the first portion of material.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended temporary die support structures will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such temporary die support dies structures, and implementing components and methods, consistent with the intended operation and methods.

Figure 1:
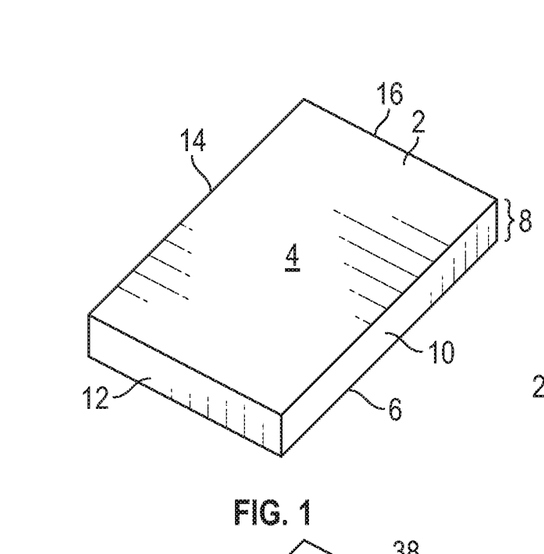
FIG. 1 is a perspective view of a semiconductor die.

Referring to FIG. 1, an implementation of a thinned semiconductor die 2 is illustrated. Various implementations of thinned semiconductor die disclosed in this document may be formed from a wide variety of semiconductor substrate types, including, by non-limiting example, silicon, polysilicon, silicon-on-insulator, glass, sapphire, ruby, gallium arsenide, silicon carbide, and any other semiconductor material type. Also, various implementations of thinned semiconductor die may include die of any of a wide variety of shapes, including, by non-limiting example, rectangular, elliptical, triangular, polygonal, or any other closed shape. The various implementations of thinned semiconductor die disclosed herein may include any of a wide variety of electronic devices, including, by non-limiting example, integrated bipolar junction transistors (IGBTs), metal oxide semiconductor field effect transistors (MOSFETs), diodes, power semiconductor devices, any semiconductor device disclosed in this document, any combination thereof, or any other active or passive semiconductor device or component, alone or in combination. As illustrated, the die 2 has a first largest planar surface 4 and a second largest planar surface 6 with thickness 8 between them. Because the die 2 is a rectangular die, four additional sides 10, 12, 14, and 16 extend across the thickness 8.

In various implementations disclosed herein, the thickness 8 of the thinned semiconductor die may be between about 0.1 microns and about 125 microns. In other implementations, the thickness may be between about 0.1 microns and about 100 microns. In other implementations, the thickness may be between about 0.1 microns and about 75 microns. In other implementations, the thickness may be between about 0.1 microns and about 50 microns. In other implementations, the thickness may be between about 0.1 microns and about 25 microns. In other implementations, the thickness may be between about 0.1 microns and about 10 microns. In other implementations, thickness may be between 0.1 microns and about 5 microns. In other implementations, the thickness may be less than 5 microns.

The various semiconductor die disclosed herein may include various die sizes. Die size generally refers to measured principal dimensions of the perimeter of the die. For example, for a rectangular die that is a square, the die size can be represented by referring to a height and width (length and width) of the perimeter. In various implementations, the die size of the semiconductor die may be at least about 4 mm by about 4 mm where the perimeter of the die is rectangular. In other implementations, the die size may be smaller. In other implementations, the die size of the semiconductor die may be about 211 mm by about 211 mm or smaller. For die with a perimeter that is not rectangular, the surface area of the largest planar surface of die may be used as a representation of the die size.

One of the effects of thinning the semiconductor die is that as the thickness decreases, the largest planar surfaces of the die may tend to warp or bend in one or more directions as the thinned material of the die permits movement of the material under various forces. Similar warping or bending effects may be observed where the die size becomes much larger than the thickness of the die for large die above about 6 mm by about 6 mm or 36 mm$^2$ in surface area. These forces include tensile forces applied by stressed films, stress created through backgrinding, forces applied by backmetal formed onto a largest planar surface of the die, and/or forces induced by the structure of the one or more devices formed on and/or in the semiconductor die. This warping or bending of the thinned semiconductor die can prevent successful processing of the die through the remaining operations needed to form a semiconductor package around the die to allow it to ultimately function as, by non-limiting example, a desired electronic component, processor, power semiconductor device, switch, or other active or passive electrical component. Being able to reduce the warpage below a desired threshold amount may permit the die to be successfully processed through the various operations, including, by non-limiting example, die bonding, die attach, package encapsulating, clip attach, lid attach, wire bonding, epoxy dispensing, pin attach, pin insertion, or any other process involved in forming a semiconductor package. In various implementations the warpage of the die may need to be reduced to less than about 50 microns measured across a largest planar surface of the die between a highest and lowest point on the largest planar surface.

In other implementations, by non-limiting example, where an assembly process involves Au—Si eutectic die attach, the warpage of the die may need to be reduced to less than about 25 microns when measured across a largest planar surface of the die. In other implementations, by non-limiting example, where a die attach process utilizing solder paste is used, the warpage of the die may need to be reduced to about 75 microns or less. In various implementations, the warpage of the die may be reduced to below about 200 microns or less. In implementations where larger die are used, more warpage may be tolerated successfully in subsequent packaging operations, so while values less than 25 microns may be desirable for many die, depending on die size, more warpage than about 25, than about 50, than about 75 microns, or up to about 200 microns may be capable of being tolerated.

In various implementations, the warpage may be measured using various techniques. For example, a capacitative scanning system with two probes that utilize changes in the capacitance for each probe when a die or wafer is inserted into the gap between the probes to determine a wafer thickness and/or position can be utilized to map the warpage of a die or wafer. An example of such a capacitive system that may be utilized in various implementations may be the system marketed under the tradename PROFORMA 300ISA by MTI Instruments Inc. of Albany, New York. In other implementations, the warpage may be measured by a laser profilometer utilizing confocal sensors marketed under the tradename ACUITY by Schmitt Industries, Inc. of Portland, Oregon. In other implementations, any of the following shape/profile measurement systems marketed by Keyence Corporation of America of Itasca, Illinois could be employed to measure die or wafer warpage: the reflective confocal displacement sensor system marketed under the tradename CL-3000, the 2D laser profiling system marketed under the tradename LJ-V7000, or the 3D interferometric sensing system marketed under the tradename WI-5000.

Figure 2:
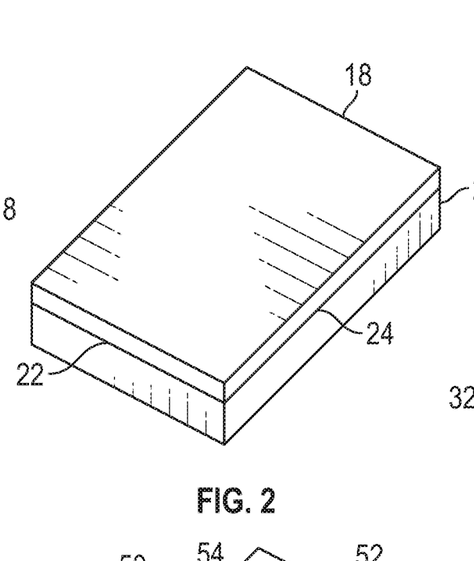
FIG. 2 is a perspective view of an implementation of a temporary die support structure (temporary die support) coupled to a largest planar surface of a semiconductor die.

Referring to FIG. 2, an implementation of a temporary die support structure (temporary die support) 18 is illustrated coupled to a semiconductor die 20. In this implementation, the temporary die support 18 is coupled to and coextensive with a perimeter 22 of a largest planar surface 24 of the die 20. However, and as described in this document, the shape of the perimeter 22 may be a wide variety of shapes, including, by non-limiting example, rectangular, triangular, polygonal, elliptical, circular, or any other closed shape. The temporary die support structure works to support the die during die packaging operations. Furthermore, the temporary die support structure 18 may include two or more portions, which will be described in this document.

In the implementation illustrated in FIG. 2, the temporary die support structure includes a material that is applied to the first largest planar surface 24 of the thinned semiconductor die 20. The material reduces the warpage of the thinned semiconductor die in any of a wide variety of ways, such as, by non-limiting example, having a predetermined hardness value, having a predetermined stiffness value, having a predetermined Shore value, having a predetermined glass transition temperature, having a predetermined cure strength, having a predetermined thickness, having a predetermined film stress, curing at a particular temperature, curing with a particular temperature ramp profile, curing using specific light wavelengths, including one or more fillers, including one or more resins, or any other compound formation process parameter, mold compound ingredient, film parameter capable of affecting the warpage of the thinned semiconductor die. While a single layer of material is illustrated as being used as the temporary die support in FIG. 2, in other implementations two or more layers of material may be employed to form the die support which contain either the same or different material compositions. These two or more layers may be applied simultaneously or sequentially in various implementations.

A wide variety of forms of materials may be employed in various implementations of temporary die supports, including, by non-limiting example, a coating (which may be applied, by non-limiting example, through painting, sputtering, evaporating, electroplating, electroless plating, or spraying or any other method of coating), a tape, a film, a printed structure, a screen printed structure, a stencil printed structure, an adhesive bonded structure, or any other material form capable of being removably or releasably coupled with the surface of a semiconductor die. A wide variety of material types may be employed in various implementations of temporary die supports, including, by non-limiting example, polyimides, polybenzoxazoles, polyethylenes, metals, benzocyclobutenes (BCBs), photopolymers, adhesives, and any other material or combination of materials capable of being removably or releasably coupled with a semiconductor die.

A wide variety of shapes and structures may be employed as temporary die support structures in various implementations that may employ any of the material types, material forms, material parameters, or film parameters disclosed in this document to reduce the warpage of a thinned die to any of the desired levels disclosed in this document. In various implementations, the flexural strength of the temporary die support material may be a factor to be considered. Flexural strength is the ability of the temporary die support material to resist plastic deformation under load. Plastic deformation occurs when the temporary die support material no longer will return to its original dimensions after experiencing the load.

Figure 3:
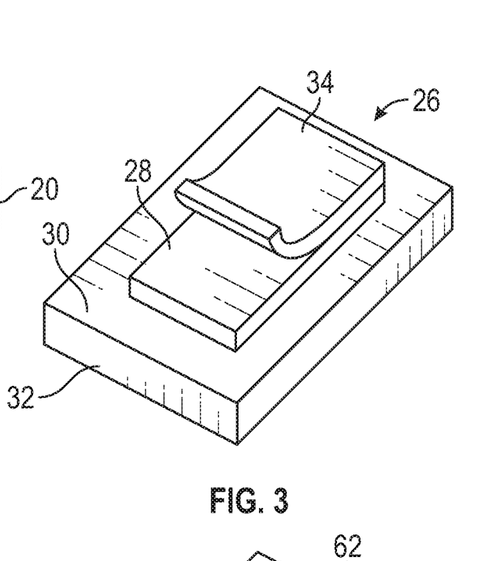
FIG. 3 a perspective view of another implementation of a second layer of temporary die support being coupled over a first layer.

Referring to FIG. 3, an implementation of a temporary die support 26 is illustrated after a first layer 28 has been applied to the largest planar surface 30 of semiconductor die 32. A second layer 34 is illustrated being coupled over the first layer 28. In various implementations, the materials of the first layer 28 and the second layer 34 may be the same or different. Also, in some implementations, the first layer 28 may be remain permanently coupled to the die 32 as a permanent die support structure while just the second layer 34 is removable therefrom. In other implementations, however, both the first layer 28 and the second layer 34 are removable or releasable from the die 32.

Figure 4:
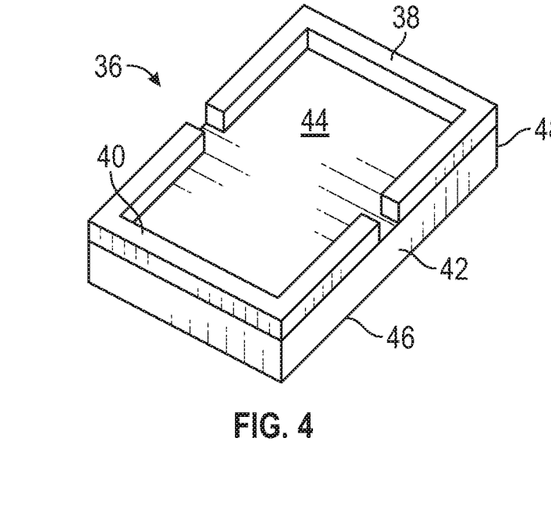
FIG. 4 is a perspective view of an implementation of a temporary die support with two C- or U-shaped portions.

Referring to FIG. 4, an implementation of a temporary die support structure 36 is illustrated that includes two C-shaped or U-shaped portions, a first portion 38 and a second portion 40. The first portion 38 and second portion 40 are separated by a gap along each side of the semiconductor die 42. The material of the die support structure 36 in this implementation is included in the first portion 38 and second portion 40 and may be any material disclosed for use in a temporary die support structure disclosed in this document. While the first portion 38 and second portion 40 are coupled to a top largest planar surface 44 of the die 42, in other implementations, they may be coupled to a bottom largest planar surface 46. In other implementations, the U- or C-shaped first portion 38 and second portion 40 are coupled just across or over the thickness 48 of the semiconductor die 42.

Figure 5:
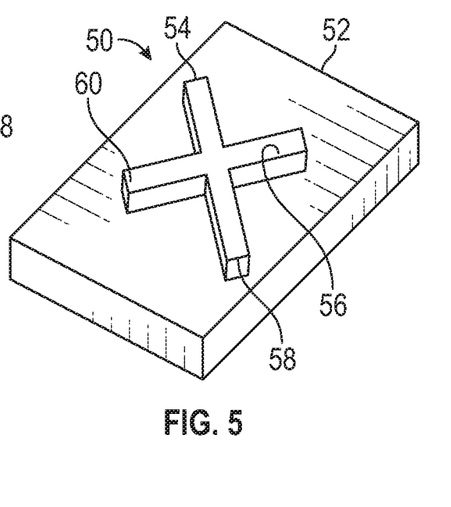
FIG. 5 is a perspective view of an implementation of a temporary die support with an X-shape.

Referring to FIG. 5, an implementation of a temporary die support structure 50 is illustrated. In this implementation, the structure 50 is formed of two intersecting lines of material, which are illustrated to be asymmetric in at least one axis. In other implementations, however, the shape of the temporary die support structure 50 may be symmetric about one or all axes. The location along the upper or lower planar surfaces of the semiconductor die 52 at which the structure 50 is coupled to the die 52 may be determined by calculations based on, by non-limiting example, die size, die surface area, die shape, localized film properties, localized stress gradients, location(s) of semiconductor devices on/within the die, die thickness, die thickness uniformity, and any other parameter affecting the warpage of a semiconductor die. Also, in this implementation of a temporary die support structure 50, the length, orientation, and or position of each of the projections 54, 56, 58, 60 of the structure 50 may be calculated and/or determined using any of the previously mentioned parameters affecting the warpage of the die 52. In other implementations of a temporary die may be X-shaped, but have a different side wall profile having rounded side walls rather than straight or substantially straight side walls. In various implementations, the side wall profile of the temporary die support 50 may also be calculated/determined using any of the previously mentioned parameters that affect the warpage of the die 52.

Figure 6:
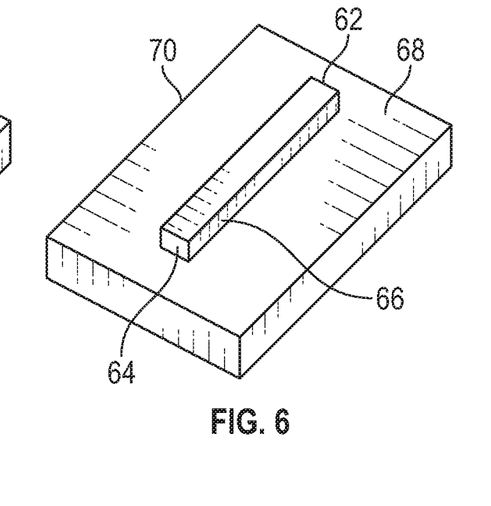
FIG. 6 is a perspective view of an implementation of a temporary die support with a rod-shape.

Referring to FIG. 6, an implementation of a temporary die support 62 is illustrated which takes the form of a rod/long rectangle with straight or substantially straight side walls. As previously discussed, the profile of the side walls 64, 66 may be changed to assist in reducing the warpage of the die 68 as can the location of the support 62 and its orientation relative to the perimeter 70 of the die 68. In various implementations, the rod may not be straight, but may be curved in one or more places to form, by non-limiting example, a C-shape, a U-shape, an S-shape, an N-shape, a M-shape, a W-shape, or any other curved shape formed from one continuous piece of material.

Figure 7:
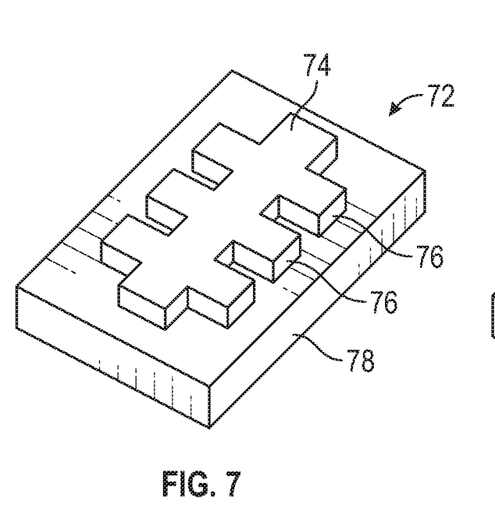
FIG. 7 is a perspective view an implementation of a temporary die support with a central portion with ribs extending therefrom.

Referring to FIG. 7, an implementation of a temporary die support 72 is illustrated which contains a central portion 74 from which a plurality of ribs 76 project. The number location, and position of the ribs 76 along the central portion 74 may be determined/calculated using any of the previously discussed parameters that affect the warpage of the die 78. The side wall profile of any or all of the ribs 76 and/or the central portion 74 may also be calculated in a similar way using the previously discussed parameters.

Figure 8:
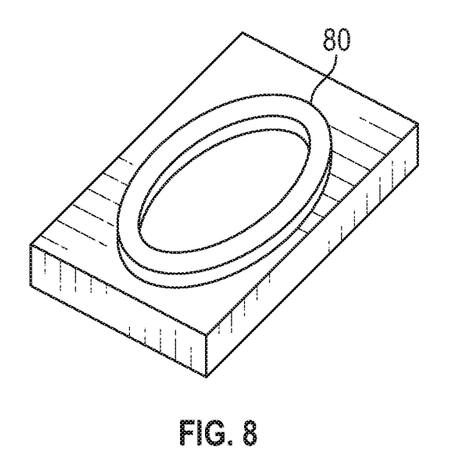
FIG. 8 is a perspective view of an implementation of a temporary die support with an elliptical shape.
Figure 14:
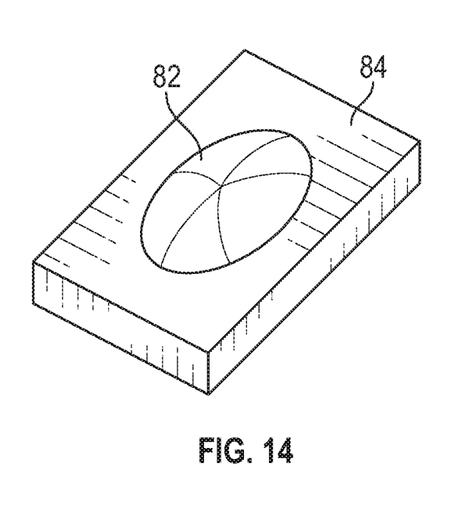
FIG. 14 is a perspective view of an implementation of a temporary die support including an elliptical shape.

In various implementations, the temporary die support need not be a shape with straight edges/lines, but, like the implementation of a temporary die support 80 illustrated in FIG. 8, may include an elliptical or spherical shape. In this implementation, the die support 80 is in the shape of an oval ring. In other implementations, however, as illustrated in FIG. 14, the overall three-dimensional shape of the die support 82 is dome-shaped as the side wall profile of the support 82 is rounded. In other implementations, however, the overall three-dimensional shape of the support 82 may be, by non-limiting example, cylindrical with straight side walls, conical with angled side walls, frustoconical with straight side walls and a flat upper surface, or any other three dimensional shape that is formed by projecting an elliptical cross-sectional shape upward from the surface of die 84.

Figure 9:
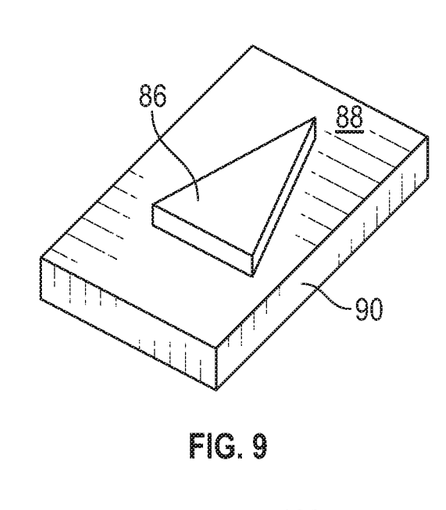
FIG. 9 is a perspective view of an implementation of a temporary die support with a triangular shape.

Referring to FIG. 9, an implementation of a temporary die support 86 that is triangular is illustrated. For those supports 86 that are triangular, the shape of the triangle may be acute, right, obtuse, equilateral, isosceles, or scalene in various implementations. As in the previously discussed, the side wall profile of the triangle and the placement of the temporary die support 86 along the largest planar surface 88 of the semiconductor die 90 may be determined by any of the previously mentioned parameters that affect the warpage of the die 90.

Figure 10:
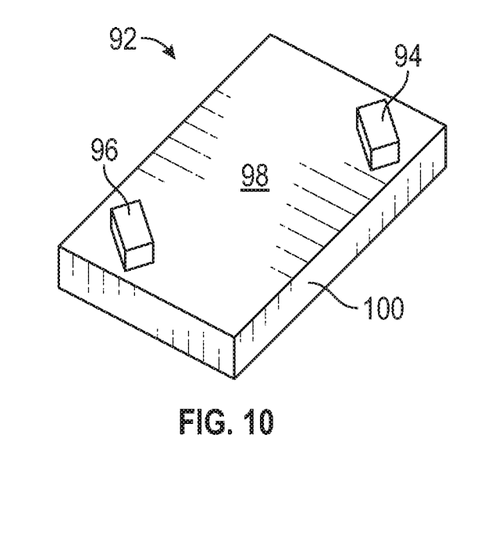
FIG. 10 is a perspective view of an implementation of a temporary die support having two portions.

In various implementations, the temporary die support can include more than one portion that is not directly attached to any other portion. Referring to FIG. 10, an implementation of a temporary die support 92 with a first portion 94 and a second portion 96 that are separately coupled to the largest planar surface 98 of semiconductor die 100. In this implementation, the specific placement, sizing, and side wall profile of each of the portions 94, 96 may be determined by any of the previously mention parameters affecting warpage of the die 100. While in the temporary die support 92 implementation illustrated in FIG. 10, the first portion 94 and second portion 96 are coupled to the largest planar surface 98, in other implementations, the different portions may be coupled on/at the thickness of the semiconductor die or on different sides of the die 100.

Figure 13:
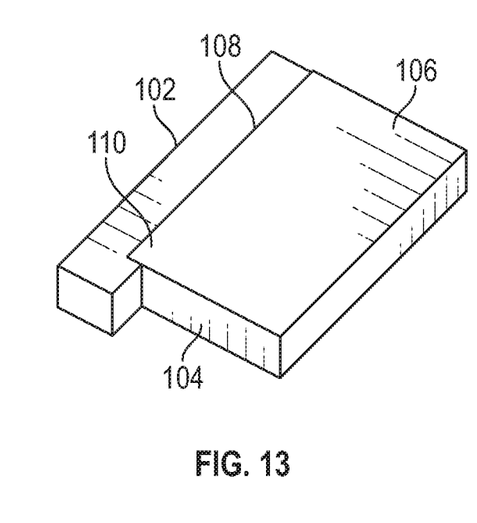
FIG. 13 is a perspective view of an implementation of a temporary die support coupled along a side and around a corner of a semiconductor die.

In other implementations of temporary die supports coupled on/at the thickness of the die, only a single portion may be utilized. Referring to FIG. 13, an implementation of a temporary die support 102 is illustrated that is coupled on the thickness 104 of semiconductor die 106 and extends fully along one side 108 of die 106 and contains a portion that wraps around corner 110 of the die. In this implementation, the length of the portion that wraps around the corner 110 may be determined by the degree to which warpage on that side/corner/edge of the die 106 needs to be minimized in various implementations. In other implementations, referring to FIG. 11, an implementation of a temporary die support 112 is illustrated coupled along only one side 114 of die 116 at the thickness 118 of the die 116. The extent to which the temporary die supports extend along the die sides and around corners may depend on any of the previously mentioned parameters that affect the warpage of the die. In other implementations, more than a single portion that extends along just one side of the die at the thickness may be employed such as portions on alternate sides of the die, portions on three sides of the die, or portions on two sides of the die.

Figures 11, 12:
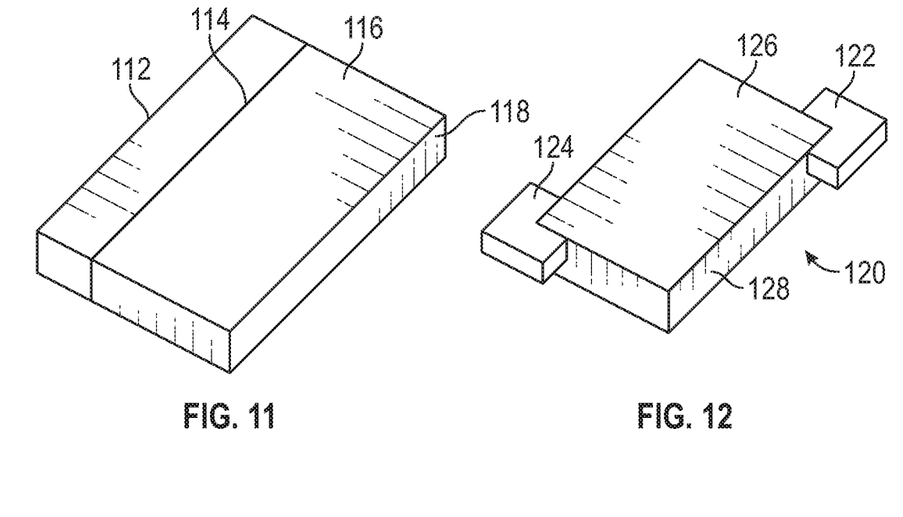
FIG. 11 is a perspective view of an implementation of a temporary die support coupled along a side of a semiconductor die.
FIG. 12 is a perspective view of an implementation of a temporary die support with two portions each coupled around a corner of a semiconductor die.

FIG. 12 illustrates an implementation of a temporary die support 120 that includes first and second portions 122, 124 respectively coupled around two corners of the semiconductor die 126 at the thickness 128 of the die. In other implementations, a temporary die support structure could also include two portions coupled at the thickness at the midpoint of each side of a semiconductor die. While the portions of the temporary die support structures illustrated in FIGS. 11 and 12 are rectangular, in other implementations, the portions may take a variety of other shapes. For example, the portions could take on a semicircular shape each coupled along the entire side of the semiconductor die. In other implementations, the temporary support structure could be coupled at the thickness along an entire length of two sides of the semiconductor die and then to each other at two points. Where the semiconductor die is triangular, the temporary die support structure may include three triangularly shaped portions each triangularly shaped as well coupled at the thickness along a side of the die. In all of these implementations of temporary die supports which are coupled at the thickness at or along a side of the die, the dimensions and materials of the supports may be selected using any of the previously mentioned parameters that affect the warpage of the die.

Figure 15:
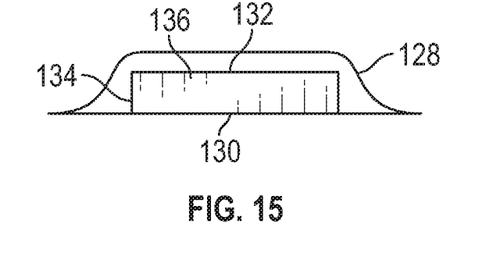
FIG. 15 is a side view of an implementation of a temporary die support coupled over a semiconductor die.
Figure 16:
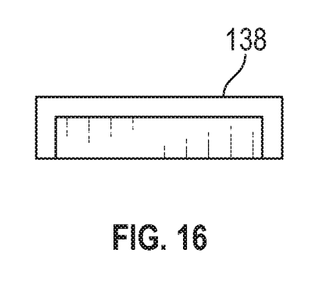
FIG. 16 a side view of an implementation of a conformal temporary die support coupled over a semiconductor de.

Referring to FIG. 15, in various implementations of temporary die supports like those disclosed herein, the temporary die support material 128 may enclose one, both, or partially fully enclose both of the largest planar surfaces 130, 132 and the thickness 134 of a semiconductor die 136. In the implementation illustrated in FIG. 15, the largest planar surface 132 and the surfaces on the thickness 134 are enclosed. Since the temporary die support is intended to be removably/releasably coupled with the die, generally the die support does not fully encloses all six sides of the die (in the case of a rectangular die). However, in some implementations where the temporary die support can be sequentially etched prior to and after die bonding, fully enclosing temporary die supports could potentially be used. The number of sides covered/partially covered by the temporary die support depends on the desired warpage values. In some implementations where the temporary die support 128 completely covers one or more sides of the die, one or more openings may be provided in/formed in the temporary die support through the material of the temporary die support 128 to allow electrical or physical connections with the die. In various implementations, the temporary die support material may be conformal, or conform to the shape of the die over which the material is coupled, as illustrated by the temporary die support 138 of FIG. 16. In other implementations, the die support material may be non-conformal or partially non-conformal forming its own shape rather than assuming part of the shape of the die as in the temporary die support 128 of FIG. 15. In various implementations, the temporary die support material may be applied as a coating to the semiconductor die.

Figure 17:
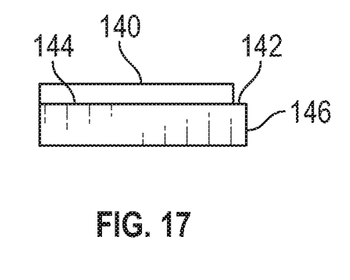
FIG. 17 is a side view of an implementation of a temporary die support coupled partially on a largest planar surface of a semiconductor die.
Figure 18:
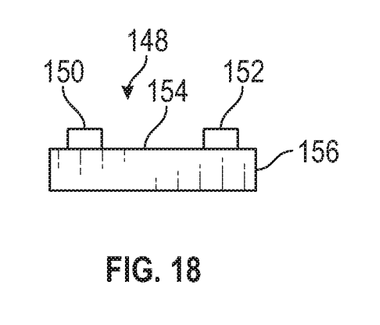
FIG. 18 is a side view of an implementation of a temporary die support with two portions coupled on a largest planar surface of a semiconductor die.
Figure 27:
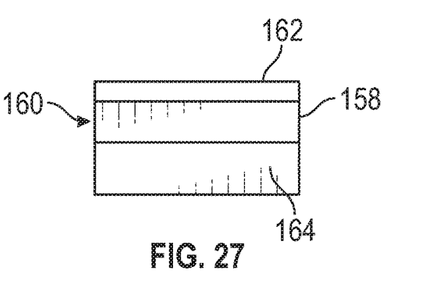
FIG. 27 is a side view of an implementation of a multi-layer temporary die support.
Figure 28:
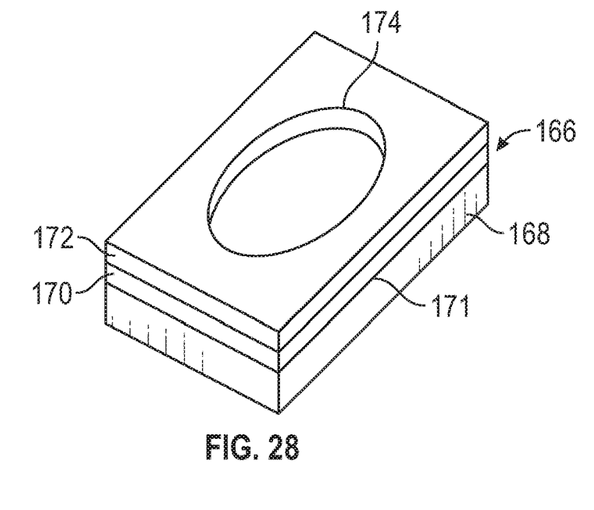
FIG. 28 is a perspective view of an implementation of a temporary die support with a first layer with a second layer having an opening therein coupled over the first layer.

Referring to FIGS. 17 and 18, side views of two implementations of temporary support structures are illustrated. In FIG. 17, an implementation of a temporary support structure 140 is illustrated that does not coextensive with the perimeter 142 of the largest planar surface 144 of a semiconductor die 146. In FIG. 18, an implementation of a temporary support structure 148 with two portions 150, 152 is illustrated indicating their position along the largest planar surface 154 of the semiconductor die 156. FIG. 27 illustrates a side view of a semiconductor die 158 with a temporary support structure 160 that includes a first layer 162 coupled on one side of the die 158 and a second layer 164 coupled on a second side of the die 158. The materials of each of the first layer 162 and 164 may be different from each other, enabling control of the warpage of the die 158 to a desired value. FIG. 28 illustrates another implementation of a temporary support structure 166 coupled to die 168 where the structure 166 includes two layers, a first layer 170 coextensive with the perimeter 171 of the die 168 and a second layer 172 coupled over the first layer 170 and containing an elliptical opening 174 therein. The dimensions, size, and positioning of opening 174 may be used to allow minimization of the warpage of the die 168 to a desired level. While a single elliptical opening in the second layer 172 is illustrated, in other implementations, multiple openings and/or openings with any closed shape may be employed in various implementations.

Figure 20:
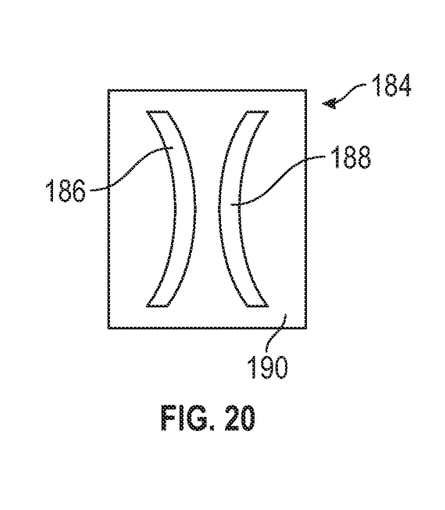
FIG. 20 is a top view of an implementation of a temporary die support structure comprising two mirrored curved portions.

Referring to FIG. 20, a top view of a temporary die support 184 is illustrated that has a first portion 186 and a second portion 188 that are curved and mirrored with respect to each other. The spacing and radius of curvature of the first portion 186 and second portion 188 may be varied to assist with controlling the warpage of the die 190. While the first portion 186 and second portion 188 are illustrated as being symmetrically arranged on the die 190 and mirrored, in other implementations, they may be asymmetrically arranged and/or not mirrored, each with different radiuses of curvature.

Figure 21:
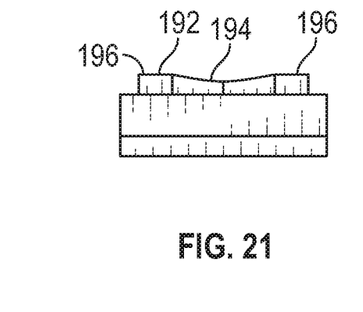
FIG. 21 is a side view of an implementation of a temporary die support structure with a varying thickness across the structure.

Referring to FIG. 21, an implementation of a temporary die support structure 192 similar to FIG. 5 is illustrated from a side view, but where thickness of the support 192 varies across the support. Here the center 194 of the support is thinner than the outer edges 196 of the support 192. In various implementations the reverse could be true and in other implementations the thickness may vary regularly or irregularly across the temporary support depending upon the desired warping control effect.

Figure 29:
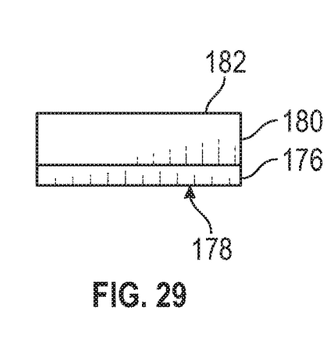
FIG. 29 is a side view of an implementation of a temporary die support having a thickness larger than a thickness of a semiconductor die.

In the various implementations of temporary die support structures disclosed herein, a thickness of the support structure may be thicker than a thickness of the die. Such a situation is illustrated in the side view in FIG. 29, where the thickness 176 of die 178 is much thinner than the thickness 180 of the temporary die support 182. A wide variety of combinations of temporary die support thicknesses, layer thicknesses used in temporary die supports, and die thicknesses may be constructed using the principles disclosed in this document.

The various implementations of temporary die support structures disclosed herein may be formed using various methods of forming a die support structure. In a particular method implementation, the method includes temporarily coupling a material with a semiconductor die. This material may be any material disclosed in this document used to form a temporary die support structure. The semiconductor die may be any type disclosed herein that includes two largest planar surfaces with a thickness between the surfaces and the thickness may be any thickness disclosed in this document. The semiconductor device(s) included on the semiconductor die may be any disclosed in this document. At the time where the material is temporarily coupled with the semiconductor die, the material may be coupled with any, all, or any combination of a first largest planar surface, a second largest planar surface, or the thickness. The method includes reducing a warpage of the semiconductor die to less than 50 microns through the coupling the material. In particular implementations the method may include reducing a warpage of the semiconductor die to less than 25 microns.

As disclosed in this document, in various method implementations, the method includes temporarily coupling two or more portions of material to the semiconductor die to one, all, or any combination of the first largest planar surface, the second largest planar surface, or the thickness. In various method implementations, the method may include temporarily coupling a second layer of material over material permanently or temporarily coupled with the semiconductor die. Additional layers beyond the second layer may also be coupled over the second layer in various method implementations.

In various method implementations, the point in a semiconductor die's processing where the temporary die support structure is coupled may vary from implementation to implementation. In some method implementations, the point at where the temporary die support structure is applied may occur before or after the semiconductor die has been physically singulated from among the plurality of semiconductor die being formed on the semiconductor substrate.

Figure 19:
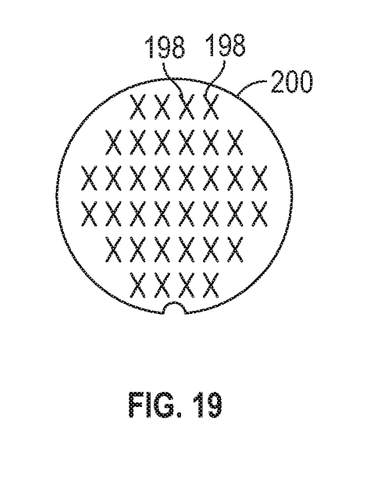
FIG. 19 is a top view of a semiconductor substrate with a plurality of die thereon with a corresponding plurality of implementations of temporary die support structures coupled thereto.

In various method implementations, the temporary die support structure may be employed before any singulation processes have been carried on for the plurality of die (or at an intermediate step while the substrate still remains in physical form). Referring to FIG. 19, a plurality of temporary die support structures 198 are illustrated distributed across a semiconductor substrate that takes the form of a wafer 200. In this implementation, the temporary die support structures are aligned, one per die.

In various method implementations, the temporary die support may be coupled prior to or after probing of the individual die. Similarly, the temporary die supports may be applied to a plurality of die on a semiconductor substrate prior to or after probing the plurality of die.

Figure 30:
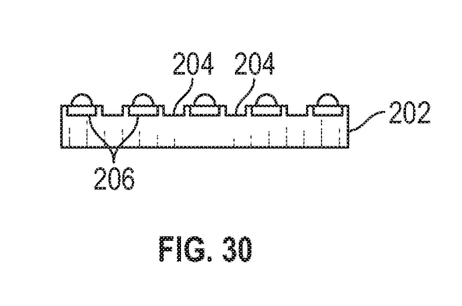
FIG. 30 is a side view of an implementation of a semiconductor substrate with a plurality of die streets therein.

In various method implementations, no precut or partial grooving between the plurality of die of a semiconductor substrate may be carried out. Where the plurality of die will be thinned, the depth of the die/saw streets/scribe lines may be sufficient to carry out the various methods of forming semiconductor packages disclosed herein. For example, and with reference to FIG. 30, where the substrate 202 will be thinned to about 10 microns, the about 5 micron depth of the die streets 204 into the material of the substrate/die resulting from the processing steps that form the plurality of semiconductor die 206 suffices to act as the equivalent of any partial grooving/precutting. In particular method implementations, the depth of the die streets can be increased during the die fabrication process. In other particular method implementations, the depth of the die streets may be increased during die preparation/packaging processes following die fabrication. In this way, any separate precut or partial grooving of the wafer using a saw or other process may be rendered unnecessary. Avoiding separately precutting/partial grooving may facilitate the sawing process and/or eliminate risk of sidewall cracking due to coefficient of thermal expansion (CTE) mismatches. While using the depth of the die streets to set sidewall coverage of mold compound rather than the depth of a precut into the semiconductor substrate may reduce the partial sidewall coverage for each die 206 of the plurality of die, the benefits may outweigh the additional coverage in various method implementations.

In various method implementations, temporary die support structures may be coupled to the plurality of die while the semiconductor substrate while it is at full thickness, or, in other words, prior to any thinning operations being performed. Additional thinning operations can then be initiated with the temporary die support structures in place. Also, for those processes where precut/grooving operations take place prior to thinning, these steps can take place after coupling of the temporary die support structures.

Figure 22:
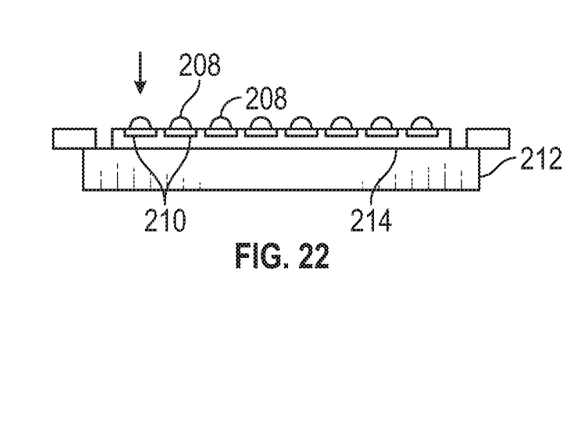
FIG. 22 is a side view of a semiconductor substrate prior to singulation with a plurality of die thereon following application of a plurality of temporary die supports thereon.

In various method implementations, the temporary die support structures 208 may be coupled over a plurality of die 210 after thinning is performed, as illustrated in the semiconductor substrate 212 of FIG. 22. In other implementations, the temporary die support structures 208 may be applied over the plurality of die 210 after backmetal layer(s) have been applied to the semiconductor substrate. In yet other method implementations, the temporary die support structures 208 may be applied over the plurality of die 210 after the semiconductor substrate 212 has been only partially thinned, such as, by non-limiting example, through removing backside oxide prior to probing, an initial grinding step prior to a polishing/lapping step, or any other process which partially removes a layer of material or bulk material from the side 214 of the semiconductor substrate 212 opposite the die 210.

In various method implementations, the temporary die support structures 208 may be applied over the plurality of semiconductor die 210 after a full backgrinding process is carried out but prior to or after a stress relief wet etching process has been carried out. In such implementations, the stress relief wet etching may be carried out with or without backmetal. In some implementations, the stress relief wet etching make take place after protecting the front side (die side) of the semiconductor substrate. The stress relief etching may reduce the backside damage to the semiconductor substrate that is caused by the backgrinding process. The use of the stress relief etching may also facilitate adhesion of the backmetal applied to the ground surface. In various implementations, the application of the temporary die support structures may be carried out prior to a backmetal formation process. A wide variety of sequences of method steps involving coupling of temporary die support structures may be carried out using the principles disclosed in this document for packaging process involving wafer scale operations like those disclosed in this document used for semiconductor substrates.

Figure 23:
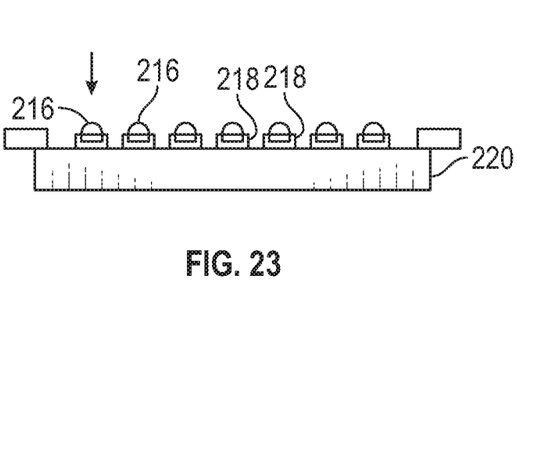
FIG. 23 is a side view of a semiconductor substrate following singulation and following application of a plurality of temporary die supports thereon.

Referring to FIG. 23, the temporary die support structures 216 may be applied to the thinned die 218 after die singulation but before die picking while the thinned die 218 are still supported on dicing tape 220. A wide variety of potential options may exist for the timing of when the temporary support structures may be applied to the die during wafer scale packaging operations.

Similarly to the timing of applying temporary die support structures during methods of wafer scale packaging a plurality die, the timing may vary in various implementations of chip scale packaging a die. For example, the temporary die support structure may be applied as the first step following die picking from a singulation tape, or immediately following die singulation prior to picking. In other method implementations, the temporary die support structure may be applied at or just prior to a later step in the process, such as, by non-limiting example, die attach, die underfilling, flux washing, epoxy cure, prior to a full encapsulating step, after lead frame attach, or any other chip scale packaging process operation. In various implementations, the temporary die support may generally be applied prior to die attach, as after die attach there may be no further need for the temporary die support. A wide variety of sequences of method steps involving coupling a temporary die support structure may be employed in various method implementations using the principles disclosed in this document.

Figure 24:
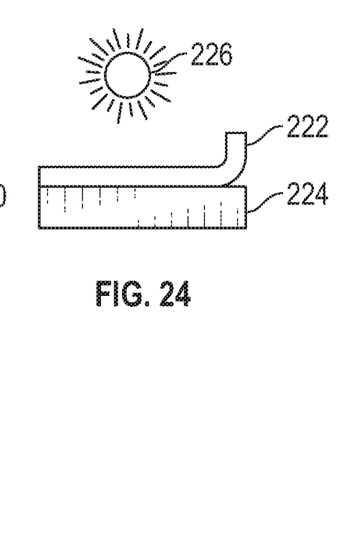
FIG. 24 is a side view of an implementation of a temporary die support while being peeling from a semiconductor die after exposure to light.

A wide variety of methods and processes may be employed to remove the temporary die supports from the die at the point in the process where the temporary supports are no longer needed. Referring to FIG. 24, an implementation of a temporary die support 222 is being illustrated while being peeled off of the surface of die 224 after or during exposure from light source 226. This light source may be, by non-limiting example, a visible light source, an infrared light source, an ultraviolet light source, a laser light source, or any other source of light capable of acting to release or assist in releasing the temporary die support. For example, if the temporary die support was a UV release tape, then the support could be peeled from the surface of the thinned die following exposure to a UV light source for a predetermined period of time after the thinned die had been attached to, by non-limiting example, a substrate, leadframe, another die, a lead, a redistribution layer, any combination thereof, or any other die bonding structure.

Figure 25:
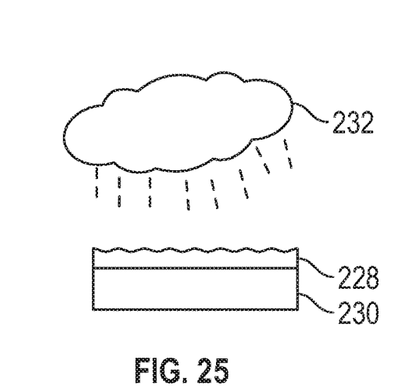
FIG. 25 is a side view of an implementation of a temporary die support being etched from a semiconductor die by a plasma etching process.

Referring to FIG. 25, a temporary die support 228 is illustrated being etched from a die 230 using a plasma etching source 232. While a plasma etching source 232 is illustrated in FIG. 25, any other etching process could be employed in various implementations, including, by non-limiting example, a wet etching process, a spray etching process, a reactive ion etching process, an ion bombardment process, a lasering process, a grinding process, or any other process capable of reacting away or ablating the material of the temporary die support.

Figure 26:
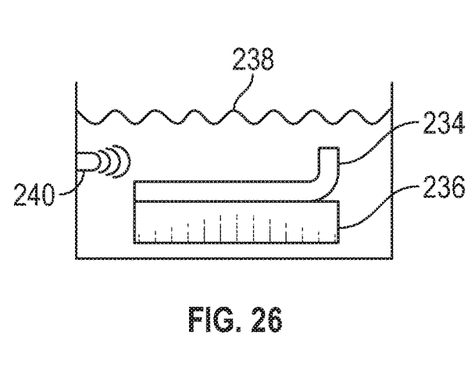
FIG. 26 is a view of a liquid bath with an ultrasonic energy source therein along with an implementation of a temporary die support being peeled from a semiconductor die under the influence of the ultrasonic energy.

In other implementations, the temporary die support may be removed using energy assisting processes. Referring to FIG. 26, an implementation of a temporary die support 234 is illustrated separating from thinned die 236 in a bath 238 under ultrasonic energy produced by ultrasonic energy source 238. Under the influence of the compression waves in the fluid of the bath 238, the temporary die support 234 may separate without requiring any pulling force, or the peeling of the temporary die support 234 may be enabled by the ultrasonic energy. While the use of a bath 238 is illustrated, in various implementations a puddle may be used. In still other implementations, the ultrasonic energy may be directly or indirectly applied to the die 236 through a spindle, a chuck, a plate, or a liquid stream. In various implementations, the source of sonic energy 238 may range from about 20 kHz to about 3 GHz. Where the sonic frequencies utilized by the ultrasonic energy source 238 are above 360 kHz, the energy source may also be referred to as a megasonic energy source. In particular implementations, the sonic energy source 238 may generate ultrasonic vibrations at a frequency of 40 kHz at a power of 80 W. In various implementations, the sonic energy source 238 may apply a frequency of between about 30 kHz to about 50 kHz or about 35 kHz to about 45 kHz. However, in various implementations, frequencies higher than 50 kHz may be employed, including megasonic frequencies. A wide variety of power levels may also be employed in various implementations.

In various semiconductor package and method implementations disclosed in this document, any of the pads or electrical connectors disclosed in this document may be formed, by any or any combination of the following: evaporation, sputtering, soldering together, screen printing, solder screen printing, silver sintering one or more layers of materials. Any of the foregoing may also be used in combination with electroplating or electroless plating methods of forming pads and/or electrical connectors.

In places where the description above refers to particular implementations of temporary die support structures and implementing components, sub-components, methods and sub-methods, it should be readily apparent that a number of modifications may be made without departing from the spirit thereof and that these implementations, implementing components, sub-components, methods and sub-methods may be applied to other temporary die support structures.

What is claimed is:

1. A semiconductor device comprising:
   A single semiconductor die comprising a first largest planar surface, a second largest planar surface and a thickness between the first largest planar surface and the second largest planar surface; and
   a temporary die support structure coupled to one of the first largest planar surface, the second largest planar surface, the thickness, or any combination thereof;
   wherein the thickness is between 0.1 microns and 125 microns; and
   wherein a warpage of the single semiconductor die is less than 200 microns.

2. The device of claim 1, wherein the warpage of the single semiconductor die is less than 25 microns.

3. The device of claim 1, wherein a perimeter of the single semiconductor die is rectangular and a size of the single semiconductor die is at least 6 mm by 6 mm.

4. The device of claim 1, wherein a perimeter of the single semiconductor die is rectangular and a size of the single semiconductor die is 211 mm by 211 mm or smaller.

5. The device of claim 1, wherein the temporary die support structure is configured to be removable by one of exposure to light, ultrasonic energy, peeling, etching, grinding, or any combination thereof.

6. The device of claim 1, wherein a perimeter of the single semiconductor die comprises a closed shape.

7. The device of claim 1, wherein the temporary die support structure comprises a perimeter comprising a closed shape.

8. The device of claim 1, further comprising a second temporary die support structure coupled to one of the first largest planar surface, the second largest planar surface, the thickness, or any combination thereof.

9. The device of claim 1, wherein the temporary die support structure comprises two or more layers.

10. A method of forming a die support structure comprising:
    temporarily coupling a material with a single semiconductor die:
      wherein the single semiconductor die comprises a first largest planar surface, a second largest planar surface and a thickness between the first largest planar surface and the second largest planar surface; and
      wherein the material is coupled with one of the first largest planar surface, the second largest planar surface, the thickness, or any combination thereof; and
    reducing a warpage of the single semiconductor die to less than 200 microns through the material.

11. The method of claim 10, further comprising removing the material using one of light, etching, peeling, ultrasonic energy, grinding, or any combination thereof.

12. The method of claim 11, further comprising removing the material after bonding the single semiconductor die to one of a substrate, a leadframe, a second semiconductor die, a lead, a redistribution layer, and any combination thereof.

13. The method of claim 10, wherein the material comprises a perimeter comprising a closed shape.

14. The method of claim 10, wherein the material is a first portion of material and further comprising:
   temporarily coupling a second portion of material with one of the first largest planar surface, the second largest planar surface, the thickness, or any combination thereof.

15. The method of claim 14, wherein the second portion of material is a second layer of material coupled over the first portion of material.

\* \* \* \* \*